(12) United States Patent
Murata et al.

(10) Patent No.: US 12,035,564 B2
(45) Date of Patent: Jul. 9, 2024

(54) DISPLAY DEVICE

(71) Applicant: SHARP KABUSHIKI KAISHA, Sakai (JP)

(72) Inventors: Koji Murata, Sakai (JP); Tokiyoshi Umeda, Sakai (JP); Yuto Tsukamoto, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 395 days.

(21) Appl. No.: 17/435,536

(22) PCT Filed: Mar. 11, 2019

(86) PCT No.: PCT/JP2019/009796
§ 371 (c)(1),
(2) Date: Sep. 1, 2021

(87) PCT Pub. No.: WO2020/183585
PCT Pub. Date: Sep. 17, 2020

(65) Prior Publication Data
US 2022/0045303 A1    Feb. 10, 2022

(51) Int. Cl.
*H10K 50/85*    (2023.01)
*H10K 59/12*    (2023.01)
*H10K 59/38*    (2023.01)

(52) U.S. Cl.
CPC ............. *H10K 50/85* (2023.02); *H10K 59/12* (2023.02); *H10K 59/38* (2023.02)

(58) Field of Classification Search
None
See application file for complete search history.

(56) References Cited

U.S. PATENT DOCUMENTS

| | | | |
|---|---|---|---|
| 10,545,378 B2 * | 1/2020 | Suzuki | G02F 1/133602 |
| 2007/0114523 A1 | 5/2007 | Oumi et al. | |
| 2012/0326180 A1 | 12/2012 | Ohe et al. | |
| 2014/0192294 A1 * | 7/2014 | Chen | G02F 1/133621 |
| | | | 362/293 |
| 2015/0285969 A1 | 10/2015 | Kim et al. | |

FOREIGN PATENT DOCUMENTS

| | | |
|---|---|---|
| JP | 2007-165284 A | 6/2007 |
| JP | 2013-254651 A | 12/2013 |
| JP | 2016-004721 A | 1/2016 |
| WO | 2011/104936 A1 | 9/2011 |

OTHER PUBLICATIONS

A machine-generated English translation of JP2013254651A (Year: 2013).*
A machine-generated English translation of JP2016004721A (Year: 2016).*

* cited by examiner

Primary Examiner — Bo B Jang
(74) Attorney, Agent, or Firm — ScienBiziP, P.C.

(57) ABSTRACT

A TFT layer; a light-emitting element layer including a first electrode, a light-emitting layer, and a second electrode; a wavelength conversion layer formed above the light-emitting element layer and being configured to convert a color of light from the light-emitting layer; a dielectric layer formed above the wavelength conversion layer; and a particle layer formed above the dielectric layer and including metal nanoparticles including a core and a shell around the core.

19 Claims, 6 Drawing Sheets

DISPLAY DEVICE

TECHNICAL FIELD

The disclosure relates to a display device.

BACKGROUND ART

In PTL1, a configuration is described in which metal particles that express plasmon resonance are contained in a wavelength conversion layer that emits red light upon receiving blue light and a wavelength conversion layer that emits green light upon receiving blue light.

CITATION LIST

Patent Literature

PTL 1: WO2011/104936

SUMMARY OF INVENTION

Technical Problem

In the known configuration described above, a component of the blue light for excitation is always backscattered by the plasmon resonance of the metal particles before irradiating the luminescent body of the wavelength conversion layer, giving rise to a problem in that the intensity of the red light and the green light cannot be effectively increased.

Solution to Problem

A display device according to an embodiment of the disclosure includes:
- a light-emitting element layer including a TFT layer, a first electrode, a light-emitting layer, and a second electrode,
- wherein, on a light emission side of the light-emitting element layer, a wavelength conversion layer, a dielectric layer, and a particle layer are provided in this order, and
- the particle layer includes metal nanoparticles including a core and a shell around the core.

Advantageous Effects of Disclosure

According to an aspect of the disclosure, because metal nanoparticles are contained in the particle layer above the wavelength conversion layer, excitation light (leaked light) from the light-emitting element layer that has not been wavelength converted by the wavelength conversion layer can be backscattered by the metal nanoparticles and be incident on the wavelength conversion layer. In this manner, the intensity of the light wavelength converted at the wavelength conversion layer can be increased.

DESCRIPTION OF EMBODIMENTS

First Embodiment

Figure 1:
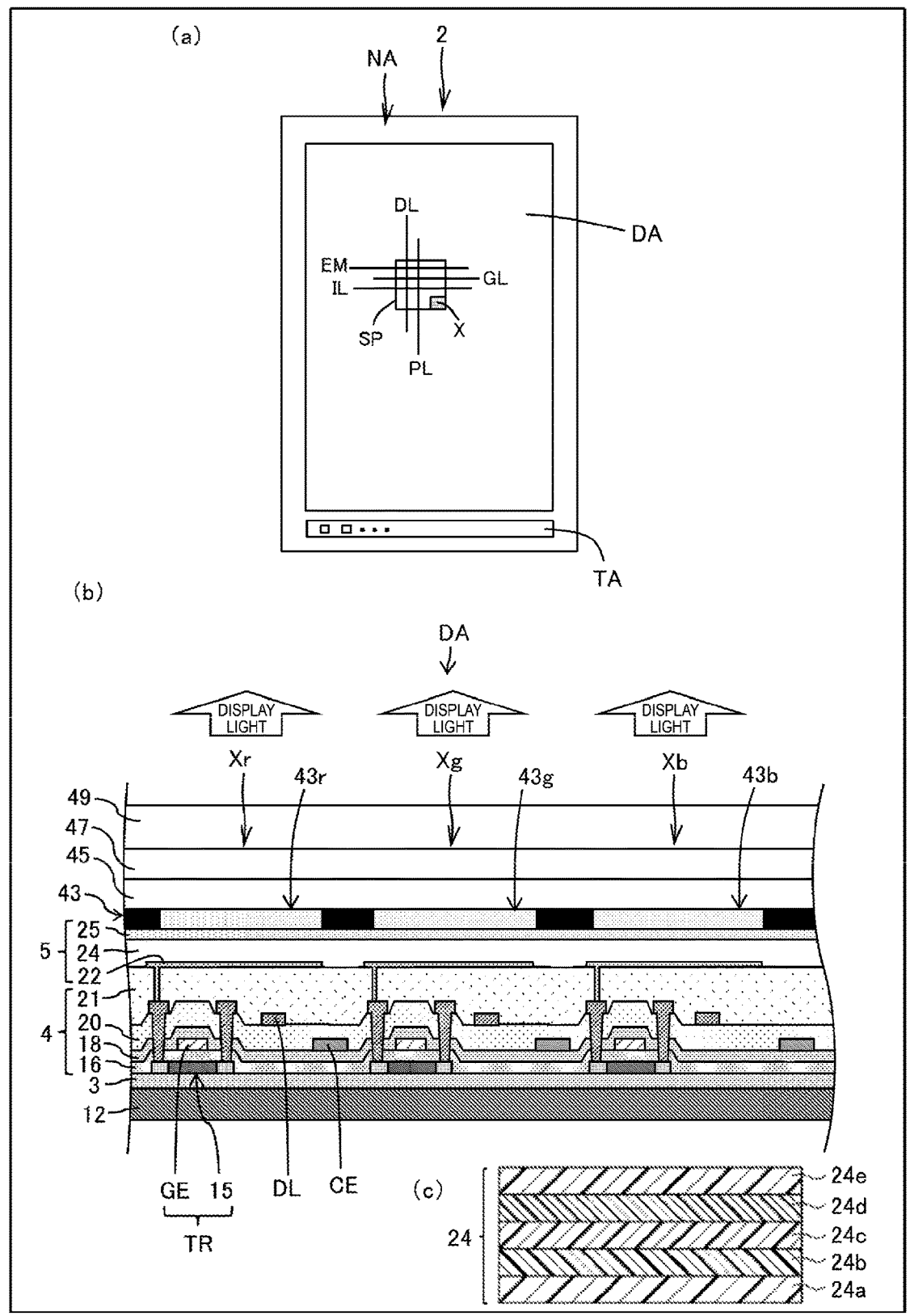
FIG. 1(a) is a schematic plan view illustrating the configuration of a display device of the first embodiment.
FIG. 1(b) is a cross-sectional view illustrating the configuration of the display device of the first embodiment.
FIG. 1(c) is a cross-sectional view illustrating the configuration of a function layer.

FIG. 1(a) is a schematic plan view illustrating the configuration of a display device of the first embodiment. FIG. 1(b) is a cross-sectional view illustrating the configuration of the display device of the first embodiment.

In the display device 2, a barrier layer 3, a thin film transistor (TFT) layer 4, a top-emitting type light-emitting element layer 5, a wavelength conversion layer 43, a dielectric layer 45, a particle layer 47, and a second substrate 49 are arranged in this order above a first substrate 12. That is, the wavelength conversion layer 43, the dielectric layer 45, and the particle layer 47 for emitting light with a wavelength different from that of the irradiated light are provided in this order on the light emission side of the top-emitting type light-emitting element layer 5. The light emission side corresponds to the upper layer side (second substrate side) in a top-emitting type and the lower layer side (first substrate side) in a bottom-emitting type. For example, the display device 2 may be configured by attaching a layered body including the second substrate 49, the particle layer 47, the dielectric layer 45, and the wavelength conversion layer 43 to the light-emitting element layer 5 on the TFT layer.

A plurality of subpixels SP are formed in a display portion DA. A terminal portion TA for mounting an electronic circuit board (IC chip, FPC, or the like) is formed in a frame portion NA surrounding the display portion DA.

The first substrate 12 may be a glass substrate or a flexible substrate including a resin film such as polyimide.

The barrier layer 3 is a layer that inhibits foreign matter such as water and oxygen from entering the TFT layer 4 and the light-emitting element layer 5, and can be constituted by a silicon oxide film, a silicon nitride film, or a silicon oxynitride film, or by a layered film of these, formed by chemical vapor deposition (CVD).

As illustrated in FIG. 1(b), the TFT layer 4 includes a semiconductor layer (including a semiconductor film 15) as an upper layer overlying the barrier layer 3, an inorganic insulating film 16 (a gate insulating film) as an upper layer overlying the semiconductor layer, a first metal layer (including a gate electrode GE) as an upper layer overlying the inorganic insulating film 16, an inorganic insulating film 18 as an upper layer overlying the first metal layer, a second metal layer (including a capacitance electrode CE) as an upper layer overlying the inorganic insulating film 18, an inorganic insulating film 20 as an upper layer overlying the second metal layer, a third metal layer (including a data signal line DL) as an upper layer overlying the inorganic insulating film 20, and a flattening film 21 as an upper layer overlying the third metal layer.

The semiconductor layer includes, for example, amorphous silicon, low-temperature polysilicon (LTPS), or an oxide semiconductor, and a thin film transistor TR is configured to include the gate electrode GE and the semiconductor film 15. The thin film transistor TP, in the diagram is a bottom gate structure, but may be a top gate structure.

The display portion DA is provided with a light-emitting element X (Xr, Xg, Xb) and a pixel circuit for each subpixel SP, and a pixel circuit and a wiring line connecting to the pixel circuit are formed in the TFT layer 4. Examples of the wiring line that connects to the pixel circuit include a scanning signal line GL and a light emission control line EM formed in the first metal layer, an initialization power source line IL formed in the second metal layer, the data signal line DL and a high voltage side power source line PL formed in the third metal layer, and the like. The pixel circuit includes a drive transistor that controls the current of the light-emitting element X, a write transistor that electrically connects to the scanning signal line GL, a light emission control transistor that electrically connects to the light emission control line EM, and the like.

The first metal layer, the second metal layer, and the third metal layer are each formed of a single layer film or a multi-layer film of metal, the metal including at least one of aluminum, tungsten, molybdenum, tantalum, chromium, titanium, and copper, for example.

Each of the inorganic insulating films 16, 18, and 20 can be formed of, for example, a silicon oxide (SiOx) film or a silicon nitride (SiNx) film, or a layered film of these, formed by using a CVD method. The flattening film 21 can be formed of, for example, a coatable organic material such as polyimide or acrylic resin.

The light-emitting element layer 5 includes a first electrode (anode) 22, an edge cover film 23 having insulating properties and covering an edge of the first electrode 22, a function layer (active layer) 24 in an upper layer overlying the edge cover film 23, and a second electrode (cathode) 25 in an upper layer overlying the function layer 24, which are formed above the flattening film 21. The edge cover film 23 is formed by applying an organic material such as a polyimide or an acrylic resin and then patterning the organic material by photolithography, for example.

The light-emitting element layer 5, the wavelength conversion layer 43, the dielectric layer 45, and the particle layer 47 form the light-emitting element Xr (red light emission), the light-emitting element Xg (green light emission), and the light-emitting element Xb (blue light emission).

The first electrode 22 and the wavelength conversion layer 43 (43r, 43g, 43b) are formed in an island shape for each light-emitting element. However, for the function layer 24, the second electrode 25, the dielectric layer 45, and the particle layer 47 may be a common layer common to a plurality of light-emitting elements. For example, as illustrated in FIG. 1(*c*), the function layer 24 is configured by layering a hole injection layer 24a, a hole transport layer 24b, a light-emitting layer 24c, an electron transport layer 24d, and an electron injection layer 24e, in this order from the first electrode 22 side. The light-emitting layer 24c, for example, is an organic layer that emits near-ultraviolet light (from 320 nm to 420 nm), but is not limited thereto, and may be an inorganic layer.

The first electrode 22 (anode electrode) is made of a layered film of, for example, Indium Tin Oxide (ITO) and an alloy including silver (Ag) and has light reflectivity. The second electrode 25 is made of, for example, a magnesium silver (MgAg) alloy and has optical transparency.

Figure 2:
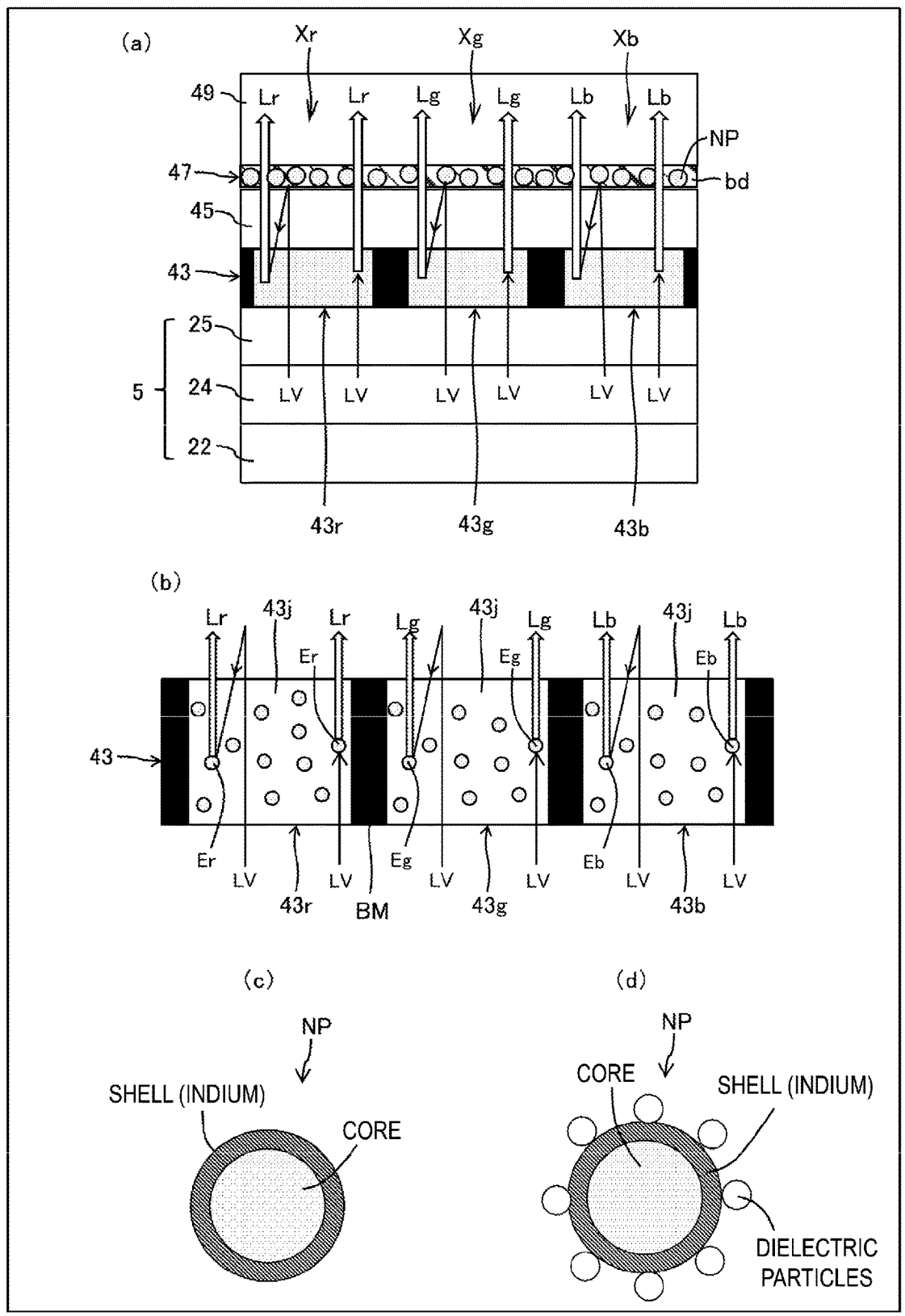
FIG. 2(a) is a cross-sectional view illustrating a configuration example of the display region.
FIG. 2(b) is a cross-sectional view illustrating the operation of a wavelength conversion layer.
FIGS. 2(c) and 2(d) are schematic diagrams illustrating the cross-sectional configurations of metal nanoparticles.

FIG. 2(*a*) is a cross-sectional view illustrating a configuration example of the display region, FIG. 2(*b*) is a cross-sectional view illustrating the operation of the wavelength conversion layer, and FIGS. 2(*c*) and 2(*d*) are schematic diagrams illustrating the cross-sectional configurations of metal nanoparticles. As illustrated in FIG. 2, the wavelength conversion layer 43 including a red wavelength conversion layer 43r corresponding to the light-emitting element Xr, a green wavelength conversion layer 43g corresponding to the light-emitting element Xg, and a blue wavelength conversion layer 43b corresponding to the light-emitting element Xb is provided above the light-emitting element layer 5; the dielectric layer 45 is provided above the wavelength conversion layer 43; and the particle layer 47 including metal nanoparticles NP is provided above the dielectric layer 45.

Figure 3:
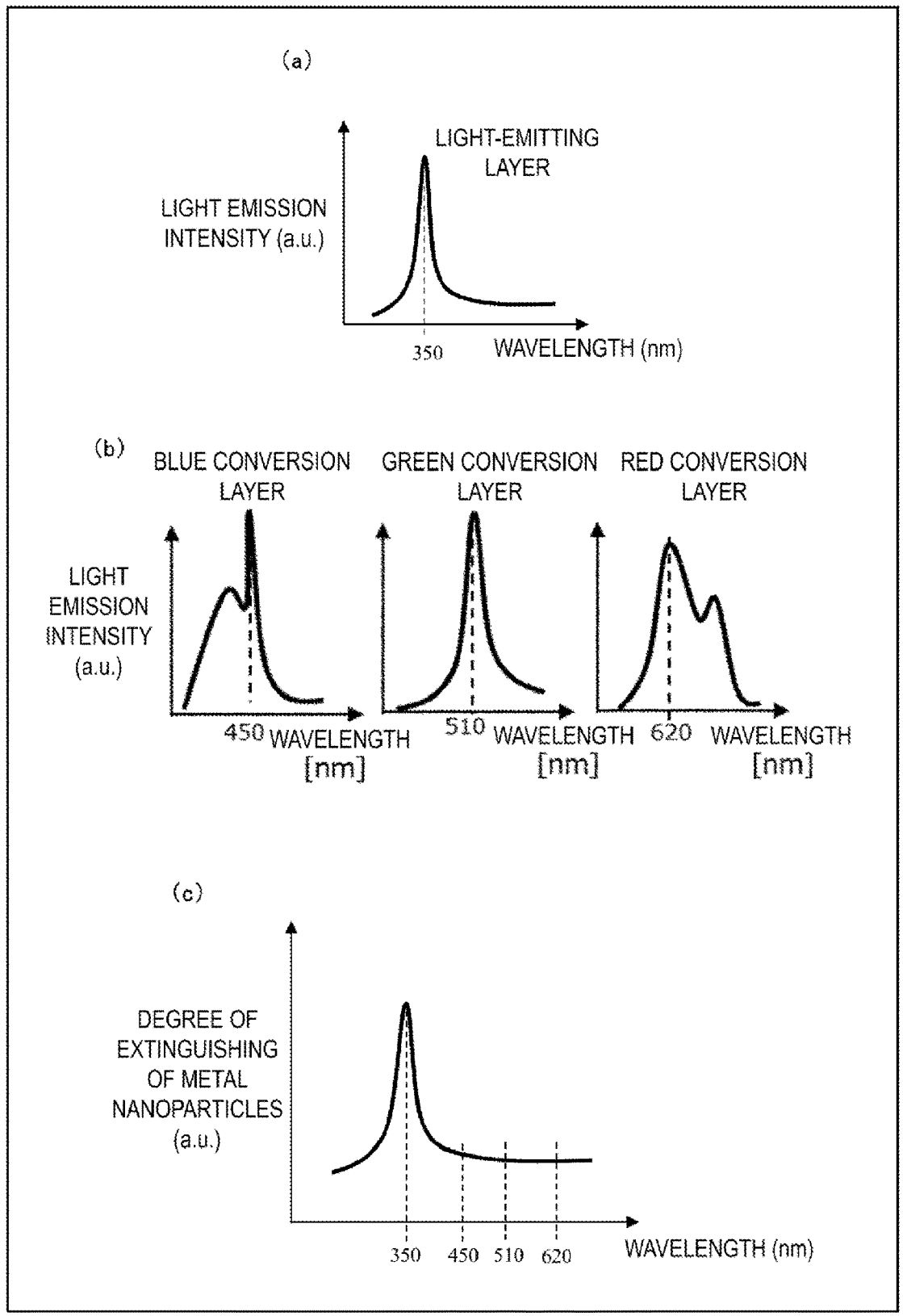
FIG. 3(a) is a graph showing the light-emission characteristics of a light-emitting layer.
FIG. 3(b) is a table showing the light-emission characteristics of a luminescent body of the wavelength conversion layer.
FIG. 3(c) is a graph showing extinction characteristics of the metal nanoparticles.

FIG. 3(*a*) is a graph showing the light-emission characteristics of the light-emitting layer, FIG. 3(*b*) is a table showing the light-emission characteristics of the luminescent body of the wavelength conversion layer, and FIG. 3(*c*) is a graph showing extinction characteristics of the metal nanoparticles. The light-emitting layer of the light-emitting element layer 5 is a common layer common to the light-emitting elements Xr, Xg, and Xb, and, as shown in FIG. 3(*a*), emits a near-ultraviolet light LV (peak wavelength of approximately 350 nm), which is excitation light, to the wavelength conversion layer 43. As the material of the light-emitting layer, for example, a triazole-based derivative TAZ can be used. The intensity of the near-ultraviolet light LV of each of the light-emitting elements Xr, Xg, and Xb is a value corresponding to the gray scale value of the corresponding subpixel.

As illustrated in FIG. 2(*b*) and shown in FIG. 3(*b*), the red wavelength conversion layer 43r includes a transparent resin 43j and a first luminescent body Er that is dispersed in the transparent resin 43j and emits red light Lr (peak wavelength of 620 nm) upon receiving near-ultraviolet light. The green wavelength conversion layer 43g includes the transparent resin 43j and a second luminescent body Eg that is dispersed in the transparent resin 43j and emits green light Lg (peak wavelength of 510 nm) upon receiving near-ultraviolet light. The blue wavelength conversion layer 43b includes the transparent resin 43j and a third luminescent body Eb that is dispersed in the transparent resin 43j and emits blue light Lb (peak wavelength of 450 nm) upon receiving near-ultraviolet light. Note that adjacent wavelength conversion layers are partitioned by a black matrix BM.

For the transparent resin 43j, for example, polymethyl methacrylate can be used; for the first luminescent body Er, for example, lumogen red can be used; for the second luminescent body Eg, for example, coumarin can be used; and for the third luminescent body Eb, for example, cyanoanthracene.

As illustrated in FIG. 2(*a*), the particle layer 47 is configured by dispersing the metal nanoparticles NP in a light-transmitting binder resin bd and is formed of glass or the like above the second substrate 49 as a common layer common to the light-emitting elements Xr, Xg, Xb. The dielectric layer 45 is a common layer formed level to minimize the surface of the particle layer 47 as much as possible, the film thickness is from 20 nm to 2 µm, and the material is preferably silicon oxide ($SiO_2$) or titanium oxide ($TiO_2$).

As illustrated in FIG. 2(c), the metal nanoparticles NP have a core-shell structure including a core and a shell around the core and have a particle size of from 10 to 100 nm. The core of the metal nanoparticle NP is, for example, silicon oxide ($SiO_2$), and the shell of the metal nanoparticle NP is, for example, indium (In).

The metal nanoparticles NP are configured to express plasmon resonance upon receiving near-ultraviolet light with a peak wavelength of approximately 350 nm and backscatter a large portion of the near-ultraviolet light. When light is incident on the metal nanoparticles NP, a collective oscillating motion (plasmon) of free electrons at the metal surface occurs causing the induced electric field and the incident light to resonate, and thus causing plasmon resonance that strongly extinguishes (scatters, absorbs) incident light of a specific wavelength. The properties of plasmon resonance depend on the material, shape, size, surrounding media, and the like of the metal nanoparticles NP. As shown in FIG. 3(c), the metal nanoparticles NP constituted by a core of silicon oxide and a shell of indium have an extinction peak wavelength of approximately 350 nm, almost completely scatter the near-ultraviolet light LV without almost no absorption, and do not extinguish (the light passes through to the second substrate 49 side without being scattered or absorbed) the visible light with a wavelength of 400 nm or greater (including the red light, the green light, and the blue light). Thus, as illustrated in FIG. 2(a), the metal nanoparticles NP express plasmon resonance upon receiving the near-ultraviolet light LV (leaked light) that passes through the wavelength conversion layer 43 without wavelength conversion, and the near-ultraviolet light is scattered back (to the wavelength conversion layer 43 side), while the red light Lr, green light Lg, and blue light Lb mostly pass through. Note that in indium nanoparticles that are not core-shell structures, absorption of near-ultraviolet light by plasmon resonance is predominant than scattering.

Note that the shell of the metal nanoparticle NP may be constituted by aluminum, and in this case, the same effects as in a case where the shell is constituted by indium can be obtained. As the shell of the metal nanoparticle NP, also Ag, Ti, TiO, and Si may be used.

In the first embodiment, as illustrated in FIG. 2(b), the red wavelength conversion layer 43r receives the near-ultraviolet light LV from the light-emitting layer and near-ultraviolet light (scattered light) from the metal nanoparticles NP and emits the red light Lr, the green wavelength conversion layer 43g receives the near-ultraviolet light LV from the light-emitting layer and near-ultraviolet light (scattered light) from the metal nanoparticles NP and emits the green light Lg, and the blue wavelength conversion layer 43b receives the near-ultraviolet light LV from the light-emitting layer and near-ultraviolet light (scattered light) from the metal nanoparticles NP to emit the blue light Lb. Thus, the intensity of the red light Lr, the green light Lg, and the blue light Lb can be increased compared to a known configuration in which the metal nanoparticles are dispersed in the wavelength conversion layer.

The metal nanoparticles NP are not limited to the configuration illustrated in FIG. 2(c). As illustrated in FIG. 2(d), the metal nanoparticles NP with the core-shell structure may be configured to carry dielectric particles with a smaller particle size than the core on the surface of the metal shell. The dielectric particles are, for example, silicon oxide ($SiO_2$) and have a configuration which Rayleigh scatters near-ultraviolet light with a wavelength of approximately 350 nm to the wavelength conversion layer 43 side and almost completing lets visible light pass through. In this way, the near-ultraviolet light incident on the wavelength conversion layer 43 from the particle layer 47 can be further increased, and the intensity of the red light Lr, the green light Lg, and the blue light Lb can be increased.

Second Embodiment

Figure 4:
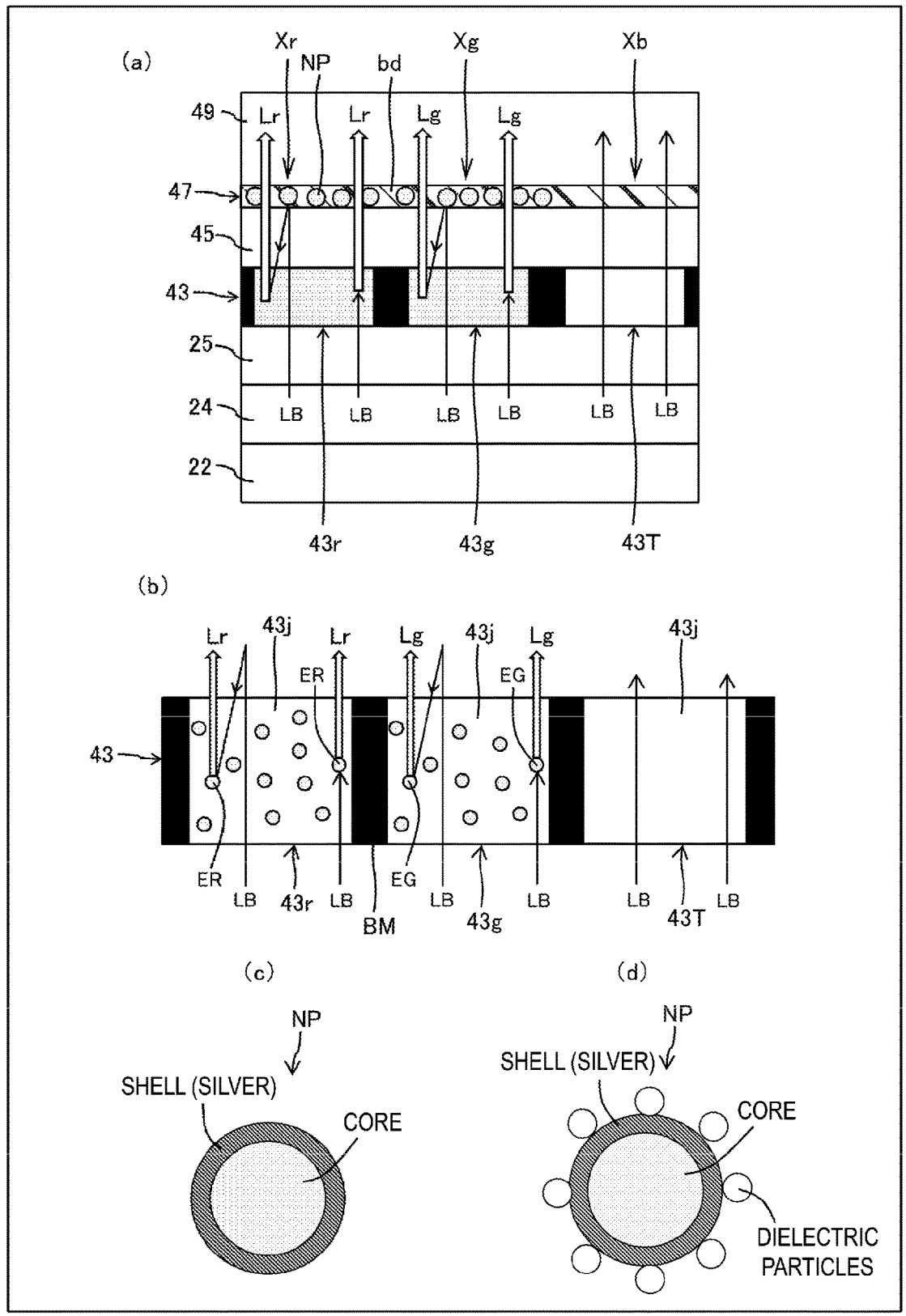
FIG. 4(a) is a cross-sectional view illustrating a configuration example of the display region.
FIG. 4(b) is a cross-sectional view illustrating the operation of the wavelength conversion layer.
FIGS. 4(c) and 4(d) are schematic diagrams illustrating the cross-sectional configurations of metal nanoparticles.

FIG. 4(a) is a cross-sectional view illustrating a configuration example of the display region, FIG. 4(b) is a cross-sectional view illustrating the operation of the wavelength conversion layer, and FIGS. 4(c) and 4(d) are schematic diagrams illustrating the cross-sectional configurations of metal particles. As illustrated in FIG. 4, the wavelength conversion layer 43 including the red wavelength conversion layer 43r corresponding to the light-emitting element Xr, the green wavelength conversion layer 43g corresponding to the light-emitting element Xg, and a transmission layer 43T corresponding to the light-emitting element Xb is provided above the light-emitting element layer 5; the dielectric layer 45 is provided above the wavelength conversion layer 43; and the particle layer 47 including metal nanoparticles NP is provided above the dielectric layer 45.

Figure 5:
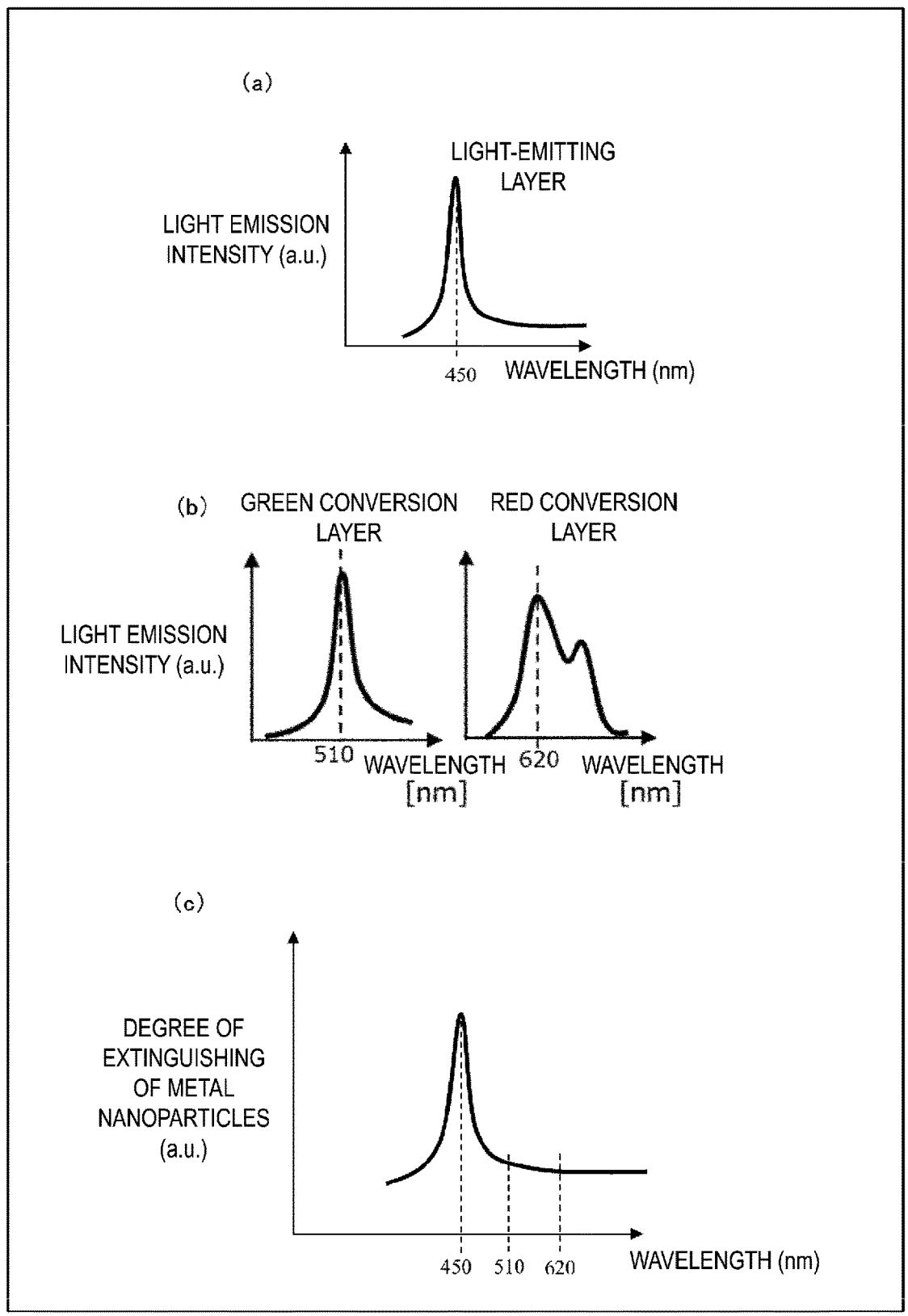
FIG. 5(a) is a graph illustrating the light-emission characteristics of the light-emitting layer.
FIG. 5(b) is a table illustrating the light-emission characteristics of the luminescent body of the wavelength conversion layer.
FIG. 5(c) is a graph illustrating extinction characteristics of the metal nanoparticles.

FIG. 5(a) is a graph illustrating the light-emission characteristics of the light-emitting layer, FIG. 5(b) is a table illustrating the light-emission characteristics of the luminescent body of the wavelength conversion layer, and FIG. 5(c) is a graph illustrating extinction characteristics of the metal nanoparticles. The light-emitting layer of the light-emitting element layer 5 is a common layer common to the light-emitting elements Xr, Xg, and Xb, and, as illustrated in FIG. 5(a), emits a blue light LB (wavelength range from 430 to 480 nm, peak wavelength of 450 nm), which is excitation light, to the wavelength conversion layer 43. The intensity of the blue light LB of each of the light-emitting elements Xr, Xg, and Xb is a value corresponding to the gray scale value of the corresponding subpixel.

As illustrated in FIG. 4(b) and FIG. 5(b), the red wavelength conversion layer 43r includes a transparent resin 43j and a fourth luminescent body ER that is dispersed in the transparent resin 43j and emits red light Lr (peak wavelength of 620 nm) upon receiving blue light. The green wavelength conversion layer 43g includes the transparent resin 43j and a fifth luminescent body EG that is dispersed in the transparent resin 43j and emits green light Lg (peak wavelength of 510 nm) upon receiving blue light. The transmission layer 43T corresponding to the light-emitting element Xb is constituted by a transparent resin 43j that allows the blue light LB to pass through.

As illustrated in FIG. 4(a), the particle layer 47 is configured by dispersing the metal nanoparticles NP in a light-transmitting binder resin bd and is formed of glass or the like above the second substrate 49. As illustrated in FIG. 4(a), in the particle layer 47, the metal nanoparticles NI are present only in the region corresponding to the light-emitting elements Xr and Xg, and there are no metal nanoparticles NP in the region corresponding to the light-emitting element Xb.

The dielectric layer 45 is a common layer formed level to minimize the surface of the particle layer 47 as much as possible, the film thickness is from 20 nm to 2 µm, and the material is preferably silicon oxide ($SiO_2$) or titanium oxide ($TiO_2$).

As illustrated in FIG. 5(c), the metal nanoparticles NP have a core-shell structure including a core and a shell around the core and have a particle size of from 10 to 100 nm. The core of the metal nanoparticle NP is, for example, silicon oxide ($SiO_2$), and the shell of the metal nanoparticle NP is, for example, silver (Ag).

The metal nanoparticles NP are configured to express plasmon resonance upon receiving blue light with a peak wavelength of approximately 450 nm and backscatter the blue light. As shown in FIG. 3(c), the metal nanoparticles NP constituted by a core of silicon oxide and a shell of silver have an extinction peak wavelength of approximately 450 nm, almost completely scatter the blue light LB without almost no absorption, and do not extinguish (the light passes through to the second substrate 49 side without being scattered or absorbed) the visible light with a wavelength of 500 nm or greater (including the red light and the green light). Thus, as illustrated in FIG. 4(a), the metal nanoparticles NP express plasmon resonance upon receiving the blue light LB (leaked light) that passes through the wavelength conversion layer 43 without wavelength conversion, and the blue light is scattered back (to the wavelength conversion layer 43 side), while the red light Lr and the green light mostly pass through. Note that in silver nanoparticles that are not core-shell structures, absorption of blue light by plasmon resonance is predominant than scattering.

In the second embodiment, as illustrated in FIG. 4(b), the red wavelength conversion layer 43r receives the blue light LB from the light-emitting layer and blue light (scattered light) from the metal nanoparticles NP and emits the red light Lr, the green wavelength conversion layer 43g receives the blue light LB from the light-emitting layer and blue light (scattered light) from the metal nanoparticles NP and emits the green light Lg. Thus, the intensity of the red light Lr and the green light Lg can be increased compared to a known configuration in which the metal nanoparticles are dispersed in the wavelength conversion layer.

The metal nanoparticles NP are not limited to the configuration illustrated in FIG. 4(c). As illustrated in FIG. 4(d), the metal nanoparticles NP with the core-shell structure may be configured to carry dielectric particles with a smaller particle size than the core on the surface of the metal shell. The dielectric particles are, for example, silicon oxide ($SiO_2$) and have a configuration which Rayleigh scatters blue light with a wavelength of 450 μm to the wavelength conversion layer 43 side. In this way, the blue light incident on the wavelength conversion layer 43 from the particle layer 47 can be further increased, and the intensity of the red light Lr and the green light Lg can be increased.

Examples of the material of the light-emitting layer that emits the blue light LB are given below.

Examples of a low molecular weight organic luminescent material include aromatic dimethylidene compounds such as 4,4'-bis(2,2'-diphenylvinyl)-biphenyl (DPVBi), oxadiazole compounds such as 5-methyl-2-[2-[4-(5-methyl-2-benzoxazolyl)phenyl]vinyl] benzoxazole, triazole derivatives such as 3-(4-biphenylyl)-4-phenyl-5-t-butylphenyl-1,2,4-triazole (TAZ), styrylbenzene compounds such as 1,4-bis(2-methylstyryl) benzene, luminescent organic material such as a fluorenone derivative, and the like.

Examples of a polymeric luminescent material include polyphenylene vinylene derivatives such as poly(2-decyloxy-1,4-phenylene) (DO-PPP) and the like and polyspiro derivatives such as poly (9,9-dioctylfluorene) (PDAF) and the like.

The light-emitting dopants, which are optionally included in the light-emitting layer, may include known dopant materials for OLEDs. Examples of such dopant material includes luminescent materials such as styryl derivatives, phosphorescent light-emitting organometallic complexes, such as bis[(4,6-difluorophenyl)-pyridinato-N,C2'] picolinate iridium (III) (FIrpic) and bis(4',6'-difluorophenyl polydinato)tetrakis(1-pyrazoyl)borate iridium (III) ($FIr_6$), and the like.

Host materials when using dopants can include known host materials for OLEDs. Examples of such host material includes, the low molecular weight luminescent material described above; the polymeric luminescent material described above; carbazole derivative, such as 4,4'-bis(carbazole) biphenyl, 9,9-di(4-dicarbazole-benzyl) fluorene (CPF), 3,6-bis (triphenylsilyl) carbazole (mCP), (PCF), and the like; aniline derivatives such as 4-(diphenylphosphofoit)-N,N-diphenylanitine (HM-A1) and the like, fluorene derivatives such as 1,3-bis(9-phenyl-9H-fluorene-9-yl)benzene (mDPFB) and 1,4-bis(9-phenyl-9H-fluorene-9-yl) benzene (pDPFB); and the like.

Examples of the material of the fourth luminescent body ER are given below.

Examples of a fluorescent dye that converts blue excitation light to red light include:
cyanine dyes: 4-dicyanomethylene-2-methyl-6-(p-dimethylaminostylyl)-4H-pyran,
pyridine dyes: 1-ethyl-2-[4-(p-dimethylaminophenyl)-1,3-butadienyl]-pyridinium-parklorate, and
rhodamine dyes: Rhodamine B, Rhodamine 6G, Rhodamine 3B, Rhodamine 101, Rhodamine 110, Basic Violet 11, Sulforhodamine 101.

Examples of a phosphor that converts green excitation light to red light include $Y_2O_2S$: $Eu^{3+}$, $Ya_1O_3$: $Eu^{3+}$, $Ca_2Y_2(SiO_4)6$: $Eu^{3+}$, $LiY_9(SiO_4)_6O_2$: $Eu^{3+}$, $YVo_4$: $Eu^{3+}$, CaS: $Eu^{3+}$, $Gd_2O_3$: $Eu^{3+}$, $Gd_3O_2S$: $Eu^{3+}$, $Y(P,V)O_4$: $Eu^{3+}$, $Mg_4GeO_{5.5}F$: $Mn^{4+}$, $Mg_{4+}$, $GeO_6$: $Mn^{4+}$, $K_5Eu_{2.5}(WO_4)_{6.25}$, $Na_5E_{2.5}(WO_4)_{6.25}$, $K_5Eu_{2.5}(MoO_4)_{6.25}$, $Na_5Eu_{2.5}(MoO_4)_{6.25}$, and the like.

Examples of the material of the fifth luminescent body EG are given below.

Examples of an organic phosphor material include, as a fluorescent dye that converts blue excitation light into green light.
coumarin dye: 2,3,5,6-1H,4H-tetrahydro-8-triflomethylquinotidine(9,9a, 1-gh) coumarin (coumarin 153), 3-(2'-benzothiazolyl)-7-diethylaminocoumarin (coumarin 6), 3-(2'-benzimidazolyl)-7-N,N-diethylaminocoumarin (coumarin 7),
naphthalimide dye: Basic Yellow 51, Solvent Yellow 11, Solvent Yellow 116, fluorescein pigment, and the like.

Examples of an inorganic phosphor material include, as a phosphor that converts blue excitation light into green light: $(BaMg)Al_{16}O_{27}$: $Eu^{2+}$, $Mn^{2+}$, $Sr_4Al_{14}O_{25}$: $Eu^{2+}$, $(SrBa)Al_{12}Si_2O_8$: $Eu^{2+}$, $(BaMg)_2SiO_4$: $Eu^{2+}$, $Y_2SiO_5$: $Ce^{3+}$, $Tb^{3+}$, $Sr_2P_2O_7$—$Sr_2B_2O_5$: $Eu^{2+}$, $(BaCaMg)_5(PO_4)3Cl$: $Eu^{2+}$, $Sr_2Si_3O_8$-$2SrCl_2$: $Eu^{2+}$, $Zr_2SiO_4$, $MgAl_{11}O_{19}$: $Ce^{3+}$, $Tb^{3+}$, $Ba_2SiO_4$: $Eu^{2+}$, $Sr_2SiO_4$: $Eu^{2+}$, $(BaSr)SiO_4$: $Eu^{2+}$, and the like.

Note that as an organic phosphorescent member, one or more selected from the group including an organometallic complex, an oxadiazole compound, a phenanthroline compound, a triazine compound, a triazole compound, and a spirofluorene compound is preferably used as the organic for the host material that converts the blue excitation light to red light and green light.

One or more selected from the group including bistienylpyridine acetylacetonate iridium, bis (benzothienylpyridine) acetylacetate iridium bis (2-phenylbenzothiazole)

acetylacetonate iridium, bis (1-phenylisoquinoline) iridium acetylacetonate, tris (1-phenylisoquinoline) iridium, and tris (2-phenylpyridine) iridium are preferably used as the phosphorescent dopant that converts blue excitation light into red light and green light.

As an inorganic phosphorescent member material, preferably CaS: $Eu^{2+}$, $Mn^{2+}$, SrS: $Eu^{2+}$, (Zn, Cd)S: Ag; $Mg_4GeO_{5.5}F$: $MN^{4+}$, ZnSe: Cu, or ZnSeS: Cu, Cl, and ZnS: $Cu^+$, $SrGa_2S_4$: $Eu^{2+}$, YAG: $BaSrGa_4S_7$: Eu are used as the material that converts blue excitation light into red light and green light.

Third Embodiment

Figure 6:
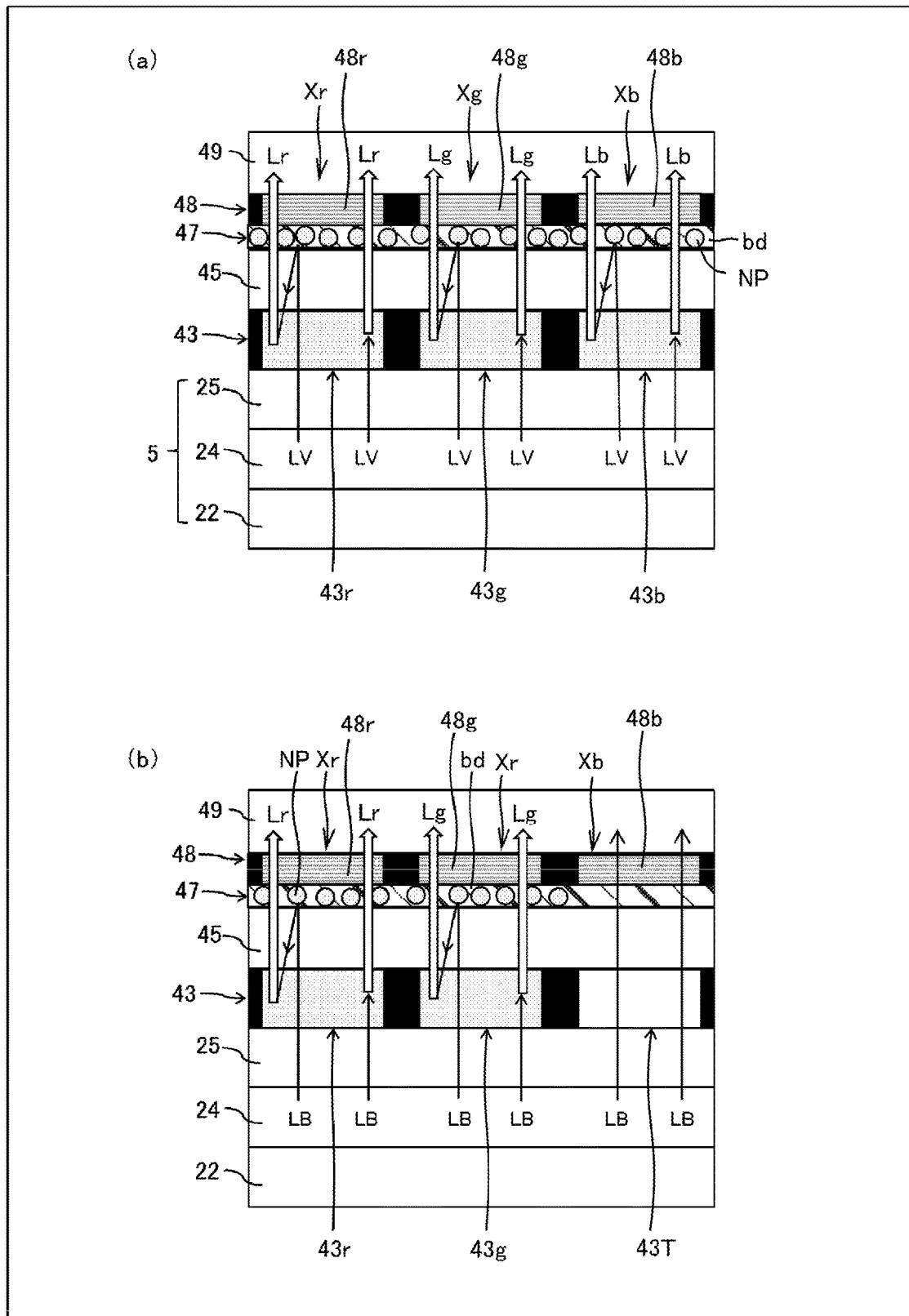
FIGS. 6(a) and 6(b) are cross-sectional views illustrating a configuration example of the display region.

FIGS. 6(a) and 6(b) are cross-sectional views illustrating a configuration example of the display region. As illustrated in FIG. 6(a), based on the configuration illustrated in FIG. 2(a), a color filter layer 48 including a red color filter 48r corresponding to the light-emitting element Xr, a green color filter 48g corresponding to the light-emitting element Xg, and a blue color filter 48b corresponding to the light-emitting element Xb may be provided above the particle layer 47.

Also, as illustrated in FIG. 6(b), based on the configuration illustrated in FIG. 4(a), the color filter layer 48 including the red color filter 48r corresponding to the light-emitting element Xr, the green color filter 48g corresponding to the light-emitting element Xg, and the blue color filter 48h corresponding to the light-emitting element Xb may be provided above the particle layer 47. In this way, the half band width of the red light, the green light, and the blue light can be reduced, and the color purity can be increased.

The embodiments described above are for the purpose of illustration and description and are not intended to be limiting. It will be apparent to those skilled in the art that many variations are possible in accordance with these examples and descriptions, Supplement First Aspect
  A display device, including:
    a light-emitting element layer including a TFT layer, a first electrode, a light-emitting layer, and a second electrode,
    wherein, on a light emission side of the light-emitting element layer, a wavelength conversion layer, a dielectric layer, and a particle layer are provided in this order, and
    the particle layer includes metal nanoparticles including a core and a shell around the core.

Second Aspect
  In the display device according to the first aspect,
    the metal nanoparticles express plasmon resonance with light from the light-emitting layer, for example.

Third Aspect
  In the display device according to the first or second aspect,
    the light-emitting layer emits near-ultraviolet light, for example.

Fourth Aspect
  In the display device according to the third aspect,
    the wavelength conversion layer includes a red wavelength conversion layer including a first luminescent body that converts the near-ultraviolet light from the light-emitting layer into red light, a green wavelength conversion layer including a second luminescent body that converts the near-ultraviolet light from the light-emitting layer into green light, and a blue wavelength conversion layer including a third luminescent body that converts the near-ultraviolet light from the light-emitting layer into blue light, for example.

Fifth Aspect
  In the display device according to the third or fourth aspect,
    the particle layer includes the metal nanoparticles and a binder resin, for example.

Sixth Aspect
  In the display device according to any one of the third to fifth aspects,
    dielectric particles are carried on a shell surface, for example.

Seventh Aspect
  In the display device according to any one of the third to sixth aspects,
    the core is made of silicon oxide, and the shell is made of indium, aluminum, or silver, for example.

Eighth Aspect
  In the display device according to the fourth aspect,
    a color filter of a corresponding color is provided above each of the red wavelength conversion layer, the green wavelength conversion layer, and the blue wavelength conversion layer, for example.

Ninth Aspect
  In the display device according to any one of the third to eighth aspects,
    the near-ultraviolet light has a wavelength range from 320 to 420 nm, for example.

Tenth Aspect
  In the display device according to the first or second aspect,
    the light-emitting layer emits blue light, for example.

Eleventh Aspect
  In the display device according to the tenth aspect,
    the wavelength conversion layer includes a red wavelength conversion layer including a fourth luminescent body that converts the blue light from the light-emitting layer into red light, a green wavelength conversion layer including a second luminescent body that converts the blue light from the light-emitting layer into green light, and a transmission layer that allows the blue light from the light-emitting layer to pass through, for example.

Twelfth Aspect
  In the display device according to the tenth or eleventh aspect,
    the particle layer includes the metal nanoparticles and a binder resin, for example.

Thirteenth Aspect
  In the display device according to any one of the tenth to twelfth aspects,
    dielectric particles are carried on a shell surface, for example.

Fourteenth Aspect
  In the display device according to any one of the tenth to thirteenth aspects,
    the core is made of silicon oxide, and the shell is made of silver, for example.

Fifteenth Aspect
  In the display device according to the eleventh aspect,
    a color filter of a corresponding color is provided above each of the red wavelength conversion layer, the green wavelength conversion layer, and the transmission layer, for example.

Sixteenth Aspect

In the display device according to any one of the tenth to fifteenth aspects, the blue light has a wavelength range from 430 to 480 nm, for example.

Seventeenth Aspect

In the display device according to any one of the first to sixteenth aspects, the dielectric layer includes silicon oxide or titanium oxide, for example.

Eighteenth Aspect

In the display device according to any one of the first to seventh aspects, the dielectric layer has a film thickness of a value ranging from 20 nm to 2 µm, for example.

The invention claimed is:

1. A display device, comprising:
a light-emitting element layer including a plurality of light-emitting elements, the plurality of light-emitting elements including a thin film transistor (TFT) layer, a plurality of first electrodes, a light-emitting layer, and a second electrode,
wherein, on a light emission side of the light-emitting element layer, each of a plurality of wavelength conversion layers corresponding to each of the plurality of light-emitting elements, a dielectric layer, and a particle layer are provided in this order,
the particle layer includes metal nanoparticles including a core and a shell around the core, and
the dielectric layer and the particle layer are commonly provided above the plurality of light emitting elements.

2. The display device according to claim 1, wherein the metal nanoparticles express plasmon resonance with light from the light-emitting layer.

3. The display device according to claim 1, wherein the light-emitting layer emits near-ultraviolet light.

4. The display device according to claim 3, wherein the plurality of wavelength conversion layers includes a red wavelength conversion layer including a first luminescent body that converts the near-ultraviolet light from the light-emitting layer into red light, a green wavelength conversion layer including a second luminescent body that converts the near-ultraviolet light from the light-emitting layer into green light, and a blue wavelength conversion layer including a third luminescent body that converts the near-ultraviolet light from the light-emitting layer into blue light.

5. The display device according to claim 4, wherein a color filter of a corresponding color is provided above each of the red wavelength conversion layer, the green wavelength conversion layer, and the blue wavelength conversion layer.

6. The display device according to claim 3, wherein the particle layer further includes a binder resin.

7. The display device according to claim 3, wherein dielectric particles are carried on a surface of the shell.

8. The display device according to claim 3, wherein the core is made of silicon oxide, and the shell is made of indium, aluminum, or silver.

9. The display device according to claim 3, wherein the near-ultraviolet light has a wavelength range from 320 to 420 nm.

10. The display device according to claim 1, wherein the light-emitting layer emits blue light.

11. The display device according to claim 10, wherein the plurality of wavelength conversion layers includes a red wavelength conversion layer including a fourth luminescent body that converts the blue light from the light-emitting layer into red light, a green wavelength conversion layer including a second luminescent body that converts the blue light from the light-emitting layer into green light, and a transmission layer that allows the blue light from the light-emitting layer to pass through.

12. The display device according to claim 11, wherein a color filter of a corresponding color is provided above each of the red wavelength conversion layer, the green wavelength conversion layer, and the transmission layer.

13. The display device according to claim 10, wherein the particle layer further includes a binder resin.

14. The display device according to claim 10, wherein dielectric particles are carried on a surface of the shell.

15. The display device according to claim 10, wherein the core is made of silicon oxide, and the shell is made of silver.

16. The display device according to claim 10, wherein the blue light has a wavelength range from 430 to 480 nm.

17. The display device according to claim 10, wherein the dielectric layer includes silicon oxide or titanium oxide.

18. The display device according to claim 1, wherein the dielectric layer has a film thickness of a value ranging from 20 nm to 2 µm.

19. The display device according to claim 1, wherein each of a plurality of color filters is provided on the particle layer, and above each of the plurality of wavelength conversion layers.

* * * * *